(12) United States Patent
Hung et al.

(10) Patent No.: US 11,259,431 B2
(45) Date of Patent: Feb. 22, 2022

(54) ROTATIONAL HOOK MECHANISM FOR DROP PREVENTION AND PROTECTION DURING MODULE REMOVAL

(71) Applicant: DELL PRODUCTS L.P., Round Rock, TX (US)

(72) Inventors: Hsiang-Yin Hung, Taipei (TW); Rui-Shen Lu, Taipei (TW); Chien Hung Chou, Sijhih (TW)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 16/541,336

(22) Filed: Aug. 15, 2019

(65) Prior Publication Data

US 2021/0050693 A1 Feb. 18, 2021

(51) Int. Cl.
*H05K 7/14* (2006.01)
*H01R 13/73* (2006.01)
*H05K 1/18* (2006.01)
*H05K 1/14* (2006.01)

(52) U.S. Cl.
CPC ........... *H05K 7/1411* (2013.01); *H01R 13/73* (2013.01); *H05K 1/144* (2013.01); *H05K 1/18* (2013.01); *H05K 7/14* (2013.01); *H05K 7/1488* (2013.01); *H05K 7/1489* (2013.01); *H05K 2201/042* (2013.01)

(58) Field of Classification Search
CPC . G06F 1/187; G06F 1/20; G06F 1/184; G06F 1/181; G06F 3/0686; G06F 1/183; G06F 3/0611; G06F 3/0631; G06F 3/0689; G06F 11/1076; G06F 3/0607; G06F 3/0626; G06F 3/0658; G06F 3/0664; H05K 7/20172; H05K 7/1487; H05K 7/1489; H05K 7/20727; H05K 7/1421; H05K 7/20736; H05K 7/02; H05K 7/14; H05K 1/144; H01R 13/62933; H01R 13/6295; H01R 13/62955
USPC .............................. 439/911; 361/679.57, 727
See application file for complete search history.

(56) References Cited

U.S. PATENT DOCUMENTS 6,272,005 B1 * 8/2001 Jensen ..................... G06F 1/184
312/223.1
6,831,839 B2 * 12/2004 Bovell ................. G11B 33/128
361/740
6,850,410 B2 * 2/2005 Peeke .................. G11B 33/125
248/562

(Continued)

FOREIGN PATENT DOCUMENTS

CN 101568481 A 10/2009
ES 2253889 T3 6/2006

(Continued)

*Primary Examiner* — Edwin A. Leon
*Assistant Examiner* — Matthew T Dzierzynski
(74) *Attorney, Agent, or Firm* — Jackson Walker LLP; Christopher J. Rourk

(57) ABSTRACT

An apparatus comprising a module, a hook assembly coupled to the module and configured to be rotated from a deployed position to a storage position when the module is fully inserted into a chassis and a spring coupled between the module and the hook assembly, wherein the spring is configured to extend the hook assembly from the storage position to the deployed position when the module is not fully inserted into the chassis.

19 Claims, 4 Drawing Sheets

(56) References Cited

U.S. PATENT DOCUMENTS

| | | | | |
|---|---|---|---|---|
| 6,856,508 B2* | 2/2005 | Rabinovitz | | G06F 1/184 |
| | | | | 248/682 |
| 6,902,421 B1* | 6/2005 | Huang | | H04N 1/00901 |
| | | | | 358/487 |
| 7,044,780 B2* | 5/2006 | Ma | | H01R 13/639 |
| | | | | 439/553 |
| 7,400,469 B2* | 7/2008 | Starr | | G11B 15/6835 |
| | | | | 360/92.1 |
| 7,944,687 B2* | 5/2011 | Walker | | G06F 1/187 |
| | | | | 361/679.37 |
| 8,341,653 B2* | 12/2012 | Terzis | | G11B 17/225 |
| | | | | 369/30.42 |
| 8,508,928 B2* | 8/2013 | Killen | | G11B 33/124 |
| | | | | 361/679.33 |
| 8,614,894 B2* | 12/2013 | Zhang | | H05K 7/1489 |
| | | | | 361/726 |
| 9,001,514 B2* | 4/2015 | Rust | | H05K 7/02 |
| | | | | 361/727 |
| 9,451,729 B2* | 9/2016 | Bailey | | H05K 7/20736 |
| 9,456,515 B2* | 9/2016 | Pecone | | H05K 13/00 |
| 9,653,124 B2* | 5/2017 | Heyd | | G11B 33/128 |
| 9,854,695 B1* | 12/2017 | Prabhakar | | H05K 7/1487 |
| 10,324,884 B2* | 6/2019 | Ehlen | | G06F 13/4068 |
| 10,372,178 B2* | 8/2019 | Chang | | H05K 7/20709 |
| 2003/0161118 A1* | 8/2003 | Bovell | | G11B 33/124 |
| | | | | 361/759 |
| 2011/0090633 A1* | 4/2011 | Rabinovitz | | G06F 1/187 |
| | | | | 361/679.31 |
| 2018/0101500 A1* | 4/2018 | Heyd | | G06F 13/4081 |

FOREIGN PATENT DOCUMENTS

| | | |
|---|---|---|
| ES | 2349547 T3 | 1/2011 |
| JP | 2011123445 A | 12/2009 |
| JP | 5532894 B2 | 6/2011 |
| JP | 5630011 B2 | 6/2011 |
| JP | 2011123448 A | 6/2011 |
| JP | 2011123449 A | 6/2011 |
| JP | 2018050641 A | 4/2018 |
| TW | I592553 | 1/2012 |

* cited by examiner

ROTATIONAL HOOK MECHANISM FOR DROP PREVENTION AND PROTECTION DURING MODULE REMOVAL

TECHNICAL FIELD

The present disclosure relates generally to equipment enclosures, and more specifically to a rotational hook mechanism for drop prevention and protection during module removal that protects components when they are being removed from an equipment enclosure.

BACKGROUND OF THE INVENTION

Equipment chassis typically do not include protection against user injury or component damage from dropped components.

SUMMARY OF THE INVENTION

An apparatus is disclosed that includes a module and a hook assembly that is coupled to the module and configured to be rotated from a deployed position to a storage position when the module is fully inserted into a chassis. A spring is coupled between the module and the hook assembly, and is configured to extend the hook assembly from the storage position to the deployed position when the module is not fully inserted the chassis.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
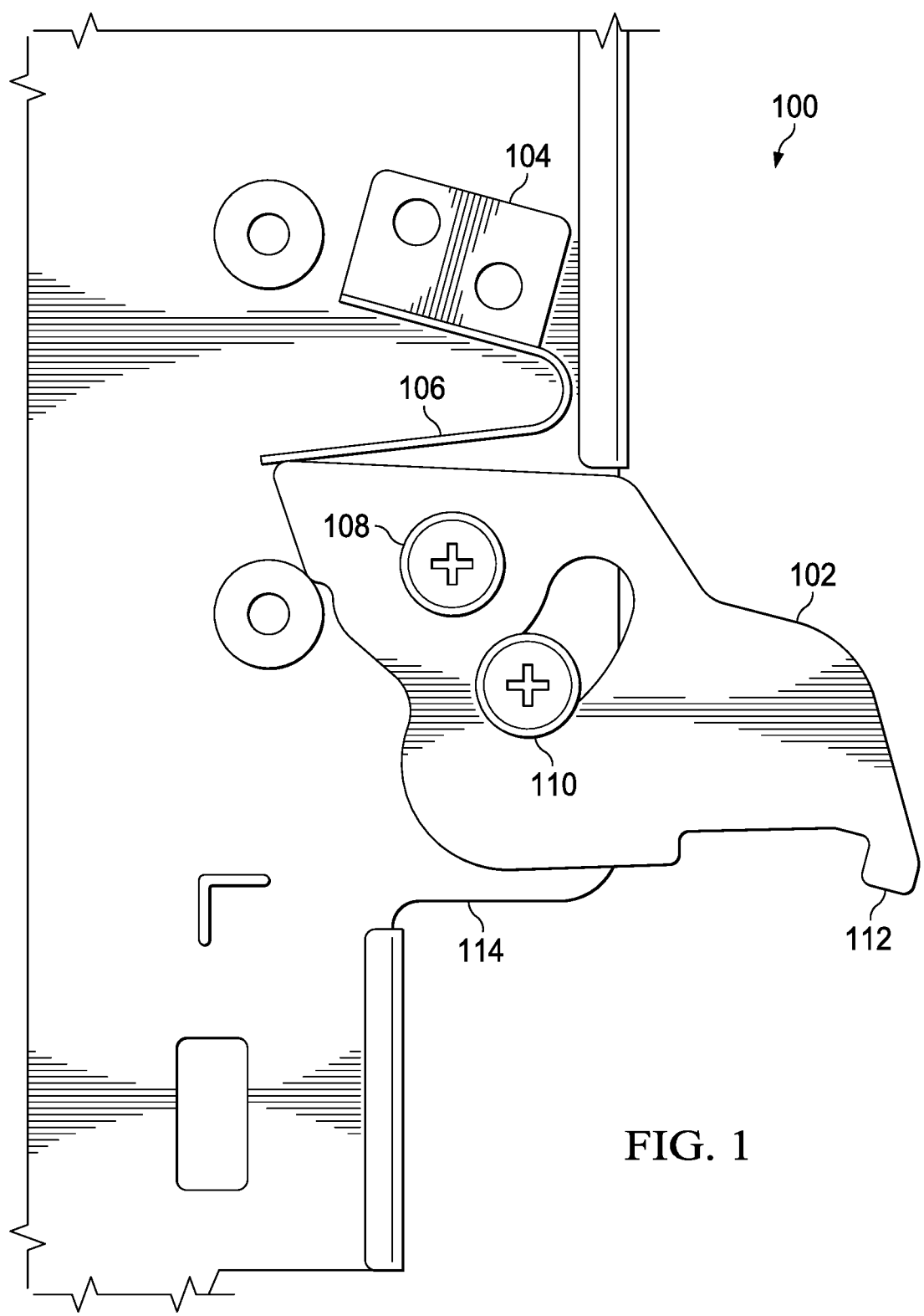
FIG. 1 is a diagram of a rotational hook mechanism, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Equipment chassis for electronics have been growing in complexity, component density and component heat load. As a result, even though components have been compartmentalized to create self-contained subassemblies, even these subassemblies have similar issues pertaining to complexity, component density and component heat load. For heavy subassemblies that are dimensionally large, safety concerns may exist for information technology (IT) and service personnel, who could be exposed to a drop hazard during removal of the subassembly. The extremely tight space in high-density chassis enclosures can prevent guide rails and other fixed mechanisms from being used for protection. The present disclosure provides a cost effective solution that overcomes the space constraints, creates a temporary support to the sled enclosure for drop prevention during sled removal, and also protects system hardware from the drop impact.

The example embodiments of the present disclosure has reduced space requirements relative to guide rails and other prior art mechanisms while still providing personnel and equipment protection against injury and damage that can arise from dropped subassemblies. These example embodiments disclose an innovation for providing a simple and effective mechanism for protecting subassemblies, which can also be used for numerous other applications. The example embodiments of the present disclosure can be used for applications where there are strict space limitations, and are cost effective and extendable to system modifications arising from increased hardware density inside the system for numerous other applications.

In one example embodiment, a rotational metal hook can be attached to a subassembly sled enclosure. The hook can be in an active or inactive position as a function of whether the subassembly sled is engaged with a part of the enclosure, such as a rear input/output module or other suitable components. When the hook is in the active position, it extends from the subassembly sled enclosure base and provides a protection over the sled connectors. The hook can grip onto the chassis base if the sled drops due to mishandling, such as by falling into a hook slot that is aligned with the subassembly sled, to stop the sled from further descending. When the hook is in the inactive position, it allows the sled connectors to engage with a rear input/output module or other suitable systems or components.

In another example embodiment, a through-hole is provided on the chassis base for the hook to fall in and catch its edge, so as to prevent equipment damage or personnel injury. A visual cue or cues can also be included to aid in guiding the user during the module removal process, such as to indicate where the user should stop the module to prevent it from falling, a direction in which the module should be pulled to enable it to be caught by the hook or other suitable cues.

FIG. 1 is a diagram of a rotational hook mechanism 100, in accordance with an example embodiment of the present disclosure. Rotational hook mechanism 100 includes hook structure 102, spring fixture 104, spring 106, pivot 108, rotation guide screw 110, hook end 112 and module 114, each of which can be fabricated from metal, plastic, composite materials, other suitable materials or a suitable combination of materials.

Hook structure 102 can be formed from the same material that chassis 116 is formed from, a material with greater impact resistance or other suitable materials. Hook structure 102 can be stamped from sheet metal, cast, die cut, laser cut or formed in other suitable manners.

Spring fixture 104 can be formed from the same material that chassis 116 is formed from, a material with greater hardness or other suitable materials. Spring fixture 104 can be secured to chassis 116 by bolts, rivets, welding or in other suitable manners.

Spring 106 can be formed from a spring metal, such as a low-alloy manganese steel, a medium-carbon steel, a high-carbon steel or other suitable materials, and applies a force to hook structure 102 that causes hook structure 102 to extend to an open position that allows it to help protect an associated equipment module on which hook structure 102 is disposed from falling. Spring 106 can be secured to spring fixture 104 by bolts, rivets, welding or in other suitable manners.

Pivot 108 can be formed from steel or other suitable materials and can be used to secure hook structure 102 to module 114. In one example embodiment, pivot 108 can include a first threaded portion that is used to secure pivot 108 to module 114, and a second unthreaded portion that is used to allow hook structure 102 to rotate. Pivot 108 can also include a bushing or other suitable structures to facilitate the rotation of hook structure 102.

Rotation guide screw 110 can be formed from steel or other suitable materials and can be used to allow hook structure 102 to rotate within a predetermined range. In one example embodiment, rotation guide screw 110 can include a first threaded portion that is used to secure rotation guide screw 110 to module 114, and a second unthreaded portion that is used to allow hook structure 102 to rotate. Rotation guide screw 110 can also include a bushing or other suitable structures to facilitate the rotation of hook structure 102.

Hook end 112 can be formed from the same material that chassis 116 is formed from, a material with greater impact resistance or other suitable materials. Hook end 112 extends from hook structure 102 and is configured to catch on a slot in an equipment chassis, to prevent module 114 from falling and potentially becoming damaged and/or causing injury.

Module 114 can be a computing module, a data storage module, a switching module or other suitable electronic systems modules that are used to perform data processing. In one example embodiment, module 114 can be included within an equipment chassis with one or more additional modules, and may need to be removed to be serviced or replaced.

In operation, rotational hook mechanism 100 allows a module 114 to be removed from a chassis with a reduced risk of damage to the module 114 or injury to personnel that are removing the module 114, such as due to removing the module beyond the end of the chassis without having adequate support to prevent the module from falling. Rotational hook mechanism 100 can rotate when module 114 is fully inserted into the chassis, and automatically rotates into position when module 114 is being removed from the chassis.

Figure 2:
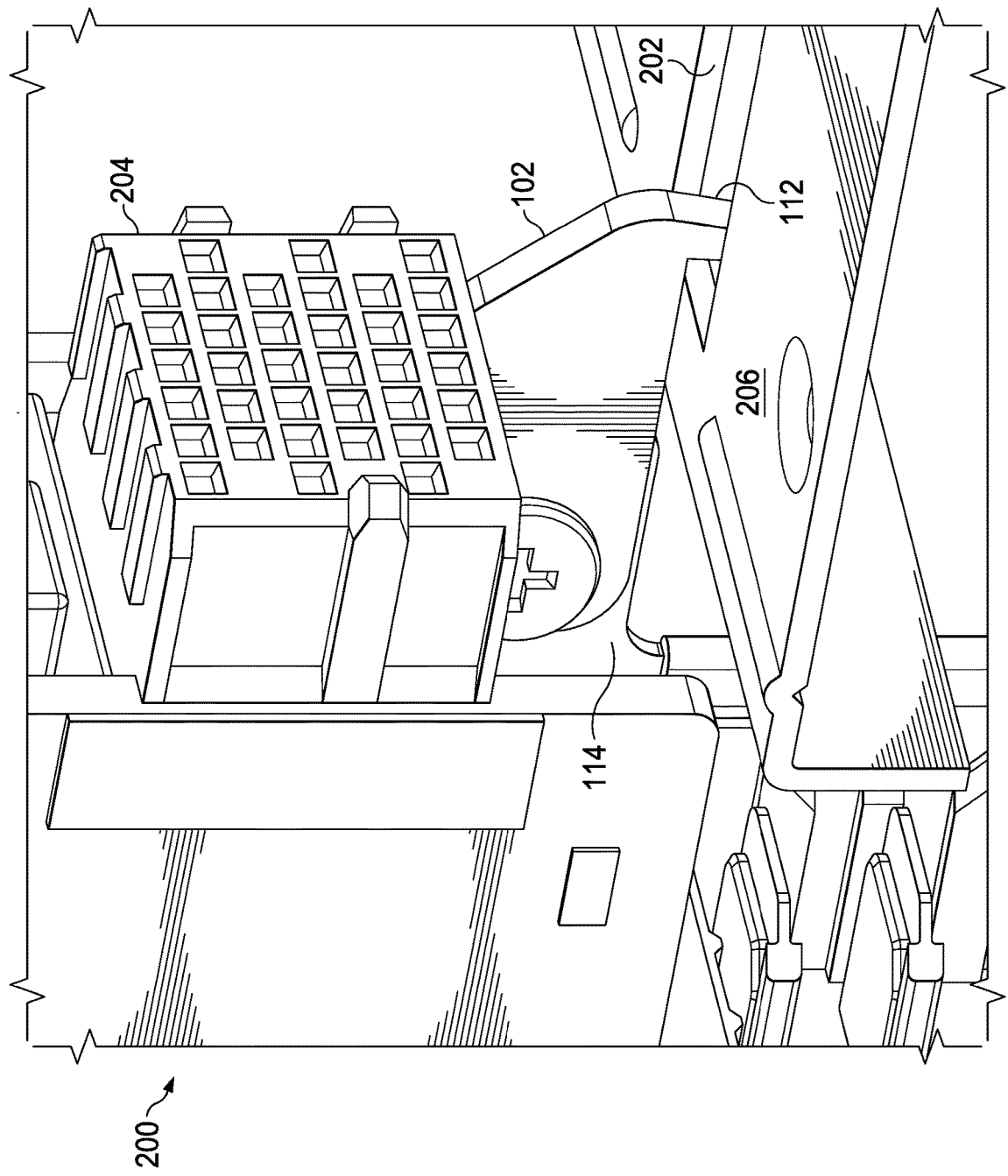
FIG. 2 is a diagram of hook assembly deployed in a slot, in accordance with an example embodiment of the present disclosure.

FIG. 2 is a diagram 200 of hook assembly 102 deployed in a slot 202, in accordance with an example embodiment of the present disclosure. Connectors 204 are typically formed of plastic or other lighter materials, and extend from the end of module 114 to connect the electronic components contained within module 114 to power busses, data busses and other chassis conductors and components. Connectors 204 can be damaged if module 114 is withdrawn from chassis 206 before a user has time to support module 114, such as may result when a user inadvertently applies too much force to remove module 114 from chassis 206. Module 114 can also be damaged if the user loses control of module 114 during the removal process and it falls on the ground or other components, and module 114 may also cause injury if it falls on the user or other personnel.

To prevent such damage to module 114, connectors 204, users and other equipment and personnel, hook structure 102 swings outward from module 114 to allow hook 112 to extend and interface with slot 202, prior to the point at which module 114 would no longer be supported by chassis 206. Because of the configuration of hook 112 and slot 202, module 114 is prevented from being further withdrawn in the direction of motion, and instead, a user must lift module 114 to allow it to be fully withdrawn from chassis 206. In this manner, module 114 is protected from damage and users are protected from injury, with only a minor additional amount of handling being required to remove module 114 from chassis 206.

Figure 3:
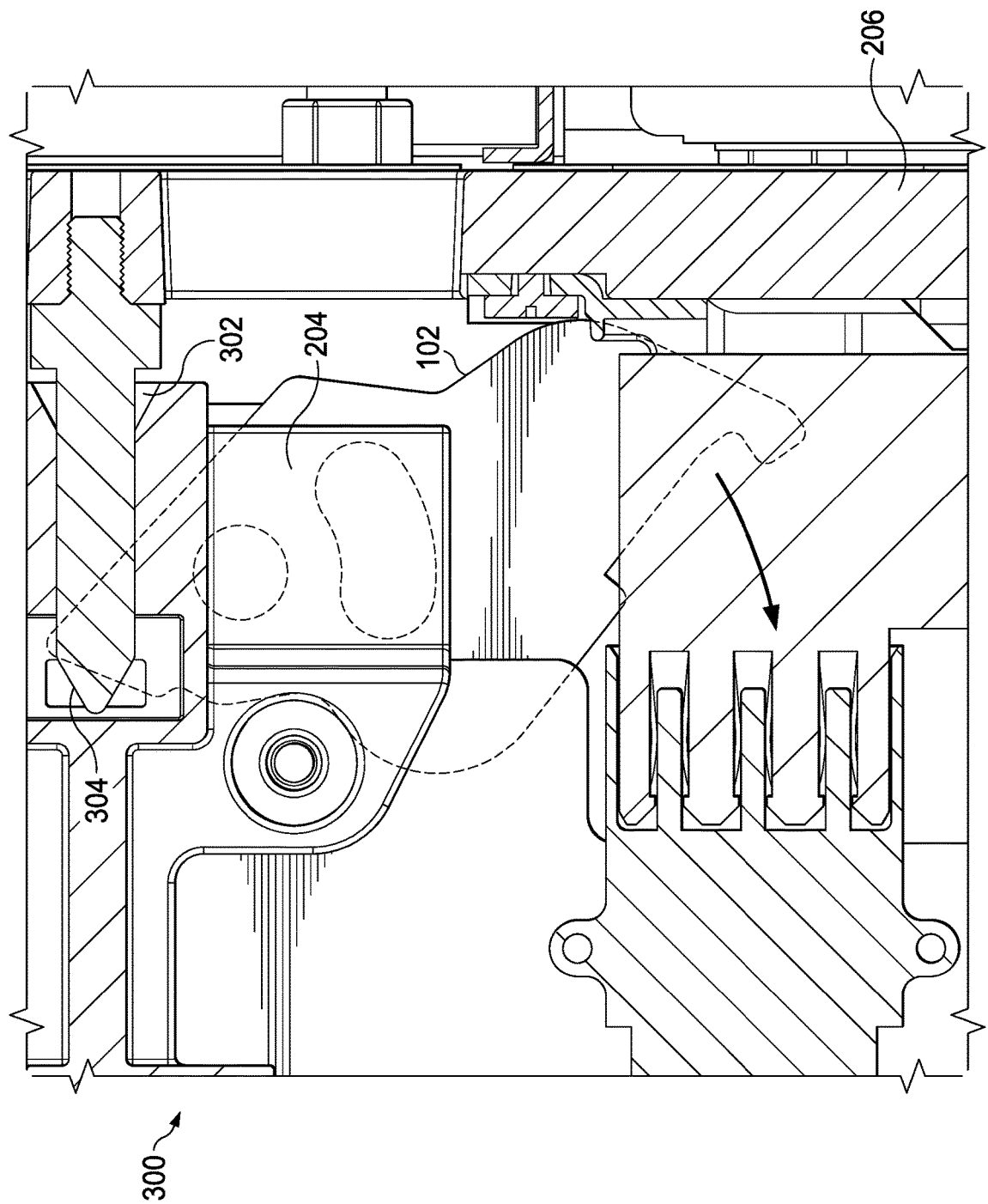
FIG. 3 is a diagram of module deployed in a chassis, in accordance with an example embodiment of the present disclosure.

FIG. 3 is a diagram 300 of module 114 deployed in chassis 206, in accordance with an example embodiment of the present disclosure. Guide pin 304 of chassis 206 is inserted in guide block 302 of module 114, and a force has been applied from chassis 206 to cause hook structure 102 to rotate into a storage position. In this configuration, connectors 204 can couple to connectors of chassis 206 (not explicitly shown).

Figure 4:
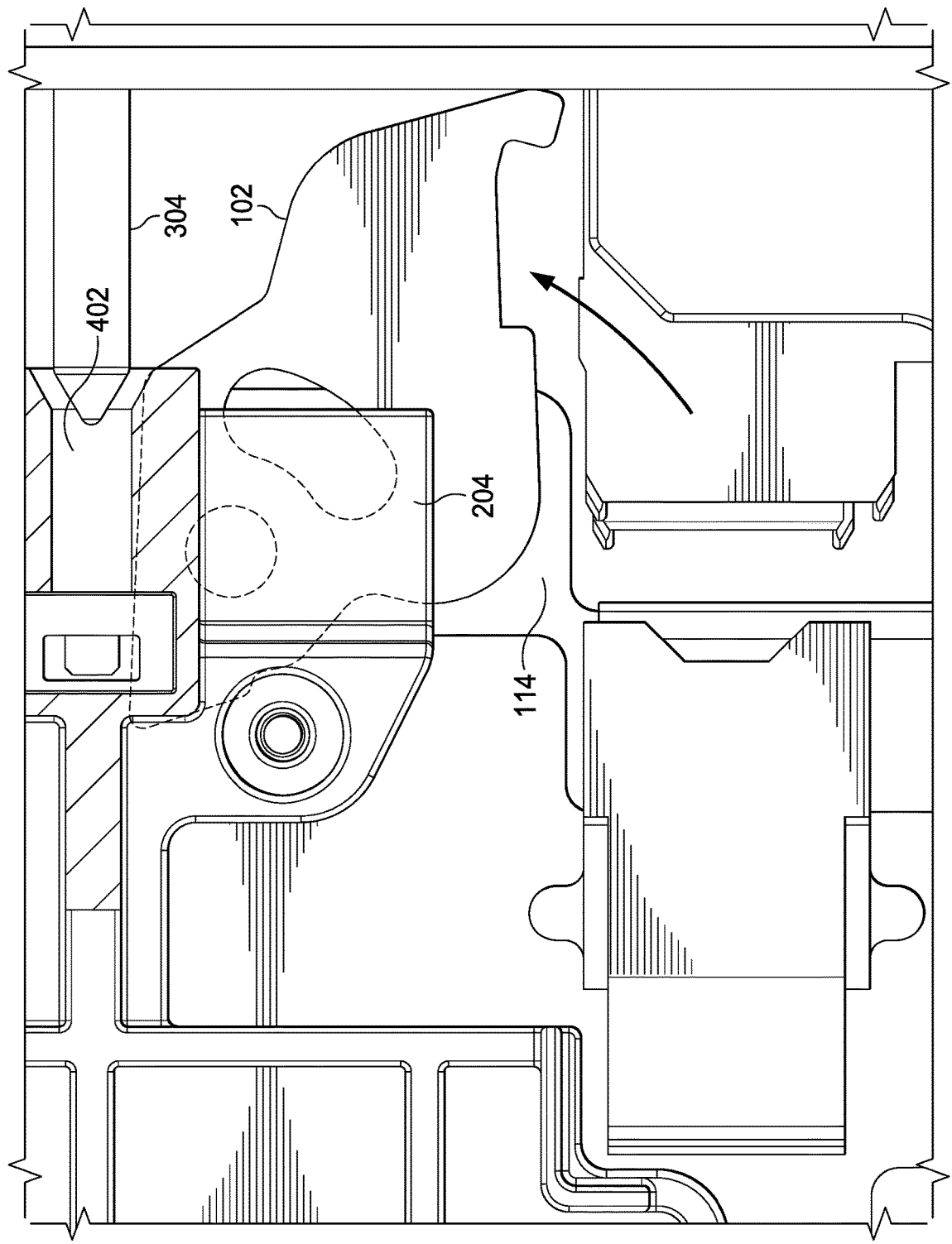
FIG. 4 is a diagram of module being removed from a chassis, in accordance with an example embodiment of the present disclosure.

FIG. 4 is a diagram 400 of module 114 being removed from chassis 206, in accordance with an example embodiment of the present disclosure. Guide pin 304 of chassis 206 has been removed from guide channel 402 of module 114, and a force has been applied from spring 106 (not explicitly shown) to cause hook structure 102 to rotate into a deployed position. In this configuration, connectors 204 can uncouple from connectors of chassis 206 (not explicitly shown), and are protected from damage if module 114 is withdrawn completely from chassis 206 before the user is able to fully support module 114.

In one example embodiment, an apparatus is disclosed that includes a module, a hook assembly coupled to the module and configured to be rotated from a deployed position to a storage position when the module is fully inserted into a chassis and a spring coupled between the module and the hook assembly, wherein the spring is configured to extend the hook assembly from the storage position to the deployed position when the module is not fully inserted into the chassis.

The apparatus can include the spring configured to apply a force to the hook assembly to cause the hook assembly to extend from the storage position to the deployed position when the module is moved from being fully inserted into the chassis to not being fully inserted into the chassis.

The apparatus can include a spring fixture coupled to the module and the spring, wherein the spring is coupled to the module through the spring fixture.

The apparatus can include the hook assembly further comprising a body portion and a hook portion.

The apparatus can include the hook assembly further comprising a slot that defines a range of rotation for the hook assembly.

The apparatus can include the hook assembly further comprising a pivot that defines a point of rotation for the hook assembly.

The apparatus can include the hook assembly coupled to the module by a pivot.

The apparatus can include the chassis further comprising a slot configured to receive the hook assembly when the module is fully removed from the chassis.

The apparatus can include the module further comprising a connector disposed over the hook assembly when the hook assembly is in the extended position and beyond an end of the module when the hook assembly is in the storage position.

The apparatus can include the module further comprising a connector coupled to the chassis when the module is fully inserted into the chassis.

In another example embodiment, the apparatus can include a chassis having a sled configured to hold the module.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An apparatus comprising:
a module;
a hook assembly coupled to the module and configured to be rotated from a deployed position to a storage position when the module is fully inserted into a chassis; and;
a spring coupled between the module and the hook assembly, wherein the spring is configured to extend the hook assembly from the storage position to the deployed position when the module is removed from the chassis, wherein the deployed position prevents the module from falling when the module is not inserted into the chassis by connecting the hook to a slot in the chassis.

2. The apparatus of claim 1 further comprising a spring fixture coupled to the module and the spring, wherein the spring is coupled to the module through the spring fixture.

3. The apparatus of claim 1 wherein the hook assembly further comprises a body portion and a hook portion.

4. The apparatus of claim 1 wherein the hook assembly further comprises a slot that defines a range of rotation for the hook assembly.

5. The apparatus of claim 1 wherein the hook assembly further comprises a pivot that defines a point of rotation for the hook assembly.

6. The apparatus of claim 1 wherein the hook assembly coupled to the module by a pivot.

7. The apparatus of claim 1 wherein the slot is configured to receive the hook assembly when the module is fully removed from the chassis.

8. The apparatus of claim 1 wherein the module further comprises a connector disposed over the hook assembly when the hook assembly is in the extended position and beyond an end of the module when the hook assembly is in the storage position.

9. The apparatus of claim 1 wherein the module further comprises a connector coupled to the chassis when the module is fully inserted into the chassis.

10. An apparatus comprising:
a module;
a chassis having a sled configured to hold the module;
a hook assembly coupled to the module and configured to be rotated from a storage position to a deployed position when the module is removed from the chassis to place a hook into a slot in the chassis, wherein the deployed position prevents the module from falling when the module is not inserted into the chassis by connecting the hook to the slot in the chassis.

11. The apparatus of claim 10 wherein a spring is configured to apply a force to the hook assembly to cause the hook assembly to extend from the storage position to the deployed position.

12. The apparatus of claim 11 further comprising a spring fixture coupled to the module and the spring, wherein the spring is coupled to the module through the spring fixture.

13. The apparatus of claim 10 wherein the hook assembly further comprises a body portion and a hook portion and prevents the module from falling when the module is not inserted into the chassis.

14. The apparatus of claim 10 wherein the slot defines a range of rotation for the hook assembly.

15. The apparatus of claim 10 wherein the hook assembly further comprises a pivot that defines a point of rotation for the hook assembly.

16. The apparatus of claim 10 wherein the hook assembly coupled to the module by a pivot.

17. The apparatus of claim 10 wherein the slot is configured to receive the hook when the module is fully removed from the chassis.

18. The apparatus of claim 10 wherein the module further comprises a connector disposed over the hook assembly when the hook assembly is in the extended position and beyond an end of the module when the hook assembly is in the storage position.

19. The apparatus of claim 10 wherein the module further comprises a connector coupled to the chassis when the module is fully inserted into the chassis.

* * * * *